United States Patent
Jauregui et al.

(10) Patent No.: US 7,098,637 B2
(45) Date of Patent: Aug. 29, 2006

(54) ACTIVE VOLTAGE POSITIONING IMPLEMENTATION FOR MICROPROCESSOR POWER SUPPLIES OR THE LIKE

(75) Inventors: David Jauregui, El Segundo, CA (US); Jason Zhang, Monterey Park, CA (US)

(73) Assignee: International Rectifier Corporation, El Segundo, CA (US)

( * ) Notice: Subject to any disclaimer, the term of this patent is extended or adjusted under 35 U.S.C. 154(b) by 154 days.

(21) Appl. No.: 10/843,165

(22) Filed: May 10, 2004

(65) Prior Publication Data

US 2004/0240238 A1 Dec. 2, 2004

Related U.S. Application Data

(60) Provisional application No. 60/470,065, filed on May 12, 2003.

(51) Int. Cl.
*G05F 1/40* (2006.01)
*H02M 7/10* (2006.01)

(52) U.S. Cl. .................................... 323/268
(58) Field of Classification Search ............... 323/268, 323/270, 273, 275, 279, 280; 363/50
See application file for complete search history.

(56) References Cited

U.S. PATENT DOCUMENTS

| | | | | |
|---|---|---|---|---|
| 6,472,856 B1 * | 10/2002 | Groom et al. | ............... | 323/284 |
| 6,683,441 B1 * | 1/2004 | Schiff et al. | ............... | 323/222 |
| 6,795,009 B1 * | 9/2004 | Duffy et al. | ............... | 341/155 |

OTHER PUBLICATIONS

Analog Applications Journal—Optimal output filter deisgn for microproscessor or DSP power supply—by Rais Miftakhutdinov—Aug. 2000.

International Rectifier- System Accuracy Analysis of the Multiphase Voltage Regulator Module by Wenkang Huang et al.—Feb. 12, 2003.
International Rectifier- A Scalable Multiphase Buck Converter with Average Current Share Bus—Feb. 12, 2003.
Active Voltage Positioning Saves Output Capacitors in Portable Computer Applications by John Seago and Ajmal Godil—Feb. 2000.
Inductors Allow Loss-Less Current Sensing in Multiphase DC—DC Converters by Wenkang Huang, et al.—Jun. 1, 2001.
Active Voltage Positioning Reduces Output Capacitors by Robert Sheehan—Nov. 1999.
Design Procedure for Microprocessor Buck Regulators byLinFinity Microelectronics—Jul. 1998.
Using Dynamic Voltage Positioning to Reduce the Number of Output Capacitors in Microprocessor Power Supplies by National Semiconductor Corporation—Jul. 2000.
CPU 5-Bit Synchronous Buck Controller—Semiconductor Components Industries—Jan. 2001.
Maxim—Max 1994 Evaluation Kit- Maxim Integrated Products—Dec. 2002.

* cited by examiner

*Primary Examiner*—Matthew V. Nguyen
(74) *Attorney, Agent, or Firm*—Ostrolenk, Faber, Gerb & Soffen, LLP

(57) ABSTRACT

An improved active voltage positioning (AVP) implementation for a power supply for a microprocessor or the like includes an AVP circuit which is separated from the power supply error amplifier by a buffer amplifier having a parallel RC feedback circuit to controllably adjust the transient response. An AVP signal derived from an output load current sensing element provides an input to the buffer amplifier. A second input is provided by power supply reference voltage. A output of the buffer amplifier is connected as an input to the error amplifier to provide the AVP window. This permits separate adjustment of the transient behavior of the error loop and the AVP loop.

12 Claims, 4 Drawing Sheets

ACTIVE VOLTAGE POSITIONING IMPLEMENTATION FOR MICROPROCESSOR POWER SUPPLIES OR THE LIKE

CROSS-REFERENCE TO RELATED APPLICATIONS

This application is based on and claims priority to U.S. Provisional Application 60/470,065, filed May 12, 2003, the entire disclosure of which is incorporated herein by reference.

BACKGROUND OF THE INVENTION

1. Technical Field of the Invention

The present invention relates to voltage regulators, and more particularly to voltage regulators for microprocessors and other applications which impose stringent demands on power supply performance. A typical modern microprocessor requires an operating voltage below 2 volts, which is stable within a quite narrow window, and currents which can switch between 0 and 50 or more amperes at a very rapid rate, and state of the art power supplies are even required to provide currents of about 100 amperes at about 1 volt, with voltage accuracies of under 1.0 percent. Very sophisticated power supply design techniques must be employed to maintain stable voltage under such conditions.

A preferred technique for controlling the output of microprocessor power supplies is active voltage positioning (AVP), the basic concept of which is illustrated in FIG. 1. According to this, the power supply output voltage is controlled as a function of the load current within an acceptable voltage window 8 defined by maximum and minimum voltages $V_{max}$ and $V_{min}$, respectively. If the output current required is low, as at 10, the output voltage is adjusted to near the top of the voltage window, so the voltage does not drop below $V_{min}$ when there is a step output current increase. Conversely, if the output current is high, as at 12, the voltage is adjusted to near the bottom of the voltage window, so the voltage does not rise above $V_{max}$ when the output current returns to a low level.

2. Relevant Art

Switching regulators employing pulse width modulation (PWM) are generally used as microprocessor power supplies. When AVP is employed, an integrated circuit (IC) controller with built-in AVP circuitry is provided. The main features of such a controller is illustrated in FIG. 2, generally denoted at 18. These include an error amplifier 20, a compensation network 22, a PWM generator 24, and at least one pair of high and low side transistor switches such as MOSFETS 26 and 28, which provide an output voltage $V_o$ to a load through an inductor-capacitor circuit 30. The load is represented by a microprocessor CPU 32, but those skilled in the art will understand that this is representative of any high current low voltage load characterized by rapid current transients which require a very stable voltage from the power supply.

For control, a signal representing voltage $V_o$ is fed back to error amplifier 20 through an input resistor 34. As will be understood skilled in the art, this signal is normally provided by a current sense element (not shown) such as shunt resistors or the drain to source resistence of the fully conductive MOSFET, $R_{dson}$, or in any other suitable manner.

A current source 36 within IC 18, which operates in response to the current feedback signal, injects a current signal into the input resistor 34 to create a voltage offset and produce AVP window 8 (See FIG. 1).

This conventional approach has two major disadvantages. First, creating an ideal AVP output voltage waveform as illustrated in FIG. 1 requires optimal settings of the gain and loop response of both the error circuit and the AVP circuit. and AVP loop response. The illustrated method does not allow the user to easily optimize both loop responses.

Secondly, input resistor 34 of error amplifier 20 is also part of the compensation network 22 which stabilizes the control loop under all operating conditions to prevent oscillation. Since the value of resistor 34 is normally set at a fixed value to establish the AVP window, this forces the user to select all of the other resistors and capacitors in compensation network 22 based on the value chosen for input resistor 34. Changing the value of resistor 34 to accommodate design changes in compensation network 22 causes the AVP window to change, thus making compensating the system cumbersome.

Accordingly, there is a need for a more flexible solution for achieving AVP in power supplies for microprocessors and the like.

SUMMARY OF THE INVENTION

It is accordingly an object of the present invention to provide an AVP methodology and implementation which allows greater flexibility for adjustment and optimization.

It is also an object of the present invention to provide an AVP methodology and implementation which permits separate adjustment of the transient response and gain of the error amplifier loop and the AVP loop to allow better control of the stability of the feedback, loop and the shape of the AVP window.

It is a further object of the present invention to provide an AVP methodology and implementation which simplifies and improves the user's ability to compensate the response for stability.

It is an additional object of the present invention to provide an AVP methodology and implementation which can be used with controllers which are not designed to provide an AVP function.

These objects are achieved in accordance with the invention by implementing the AVP function separately from the rest of the control IC, and coupling the AVP current source to the error amplifier input through a buffer circuit. The improved flexibility in compensation, and the ability to separately tune the error amplifier loop response and the AVP loop response and thereby achieve nearly ideal AVP more that makes up for any added complexity in circuit implementation.

Other features and advantages of the present invention will become apparent from the following description of the invention which refers to the accompanying drawings.

DETAILED DESCRIPTION OF PREFERRED EMBODIMENTS OF THE INVENTION

Figure 1:
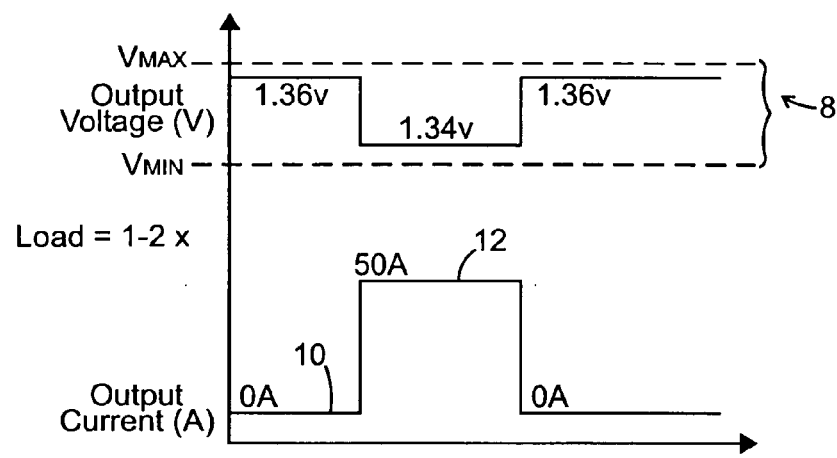
FIG. 1 is a waveform diagram illustrating the basic concept of AVP.
Figure 2:
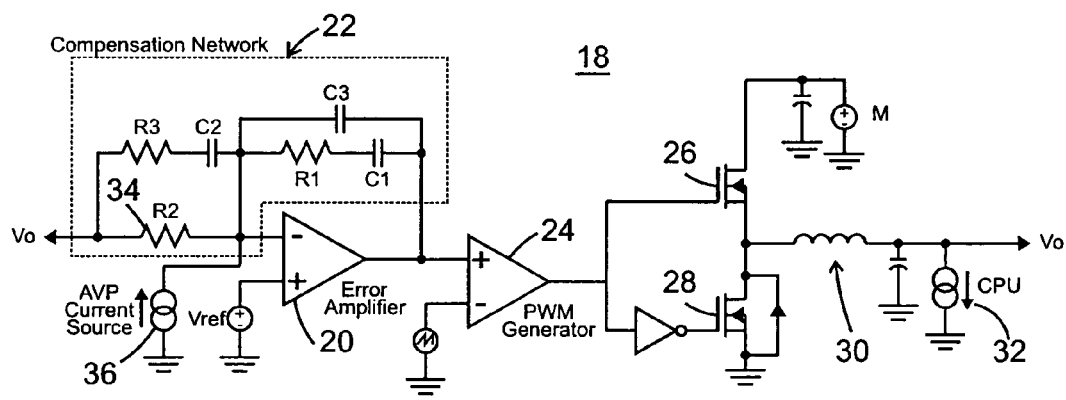
FIG. 2 is a schematic circuit diagram of a controller for a microprocessor power supply illustrating a conventional implementation of AVP.
Figure 3:
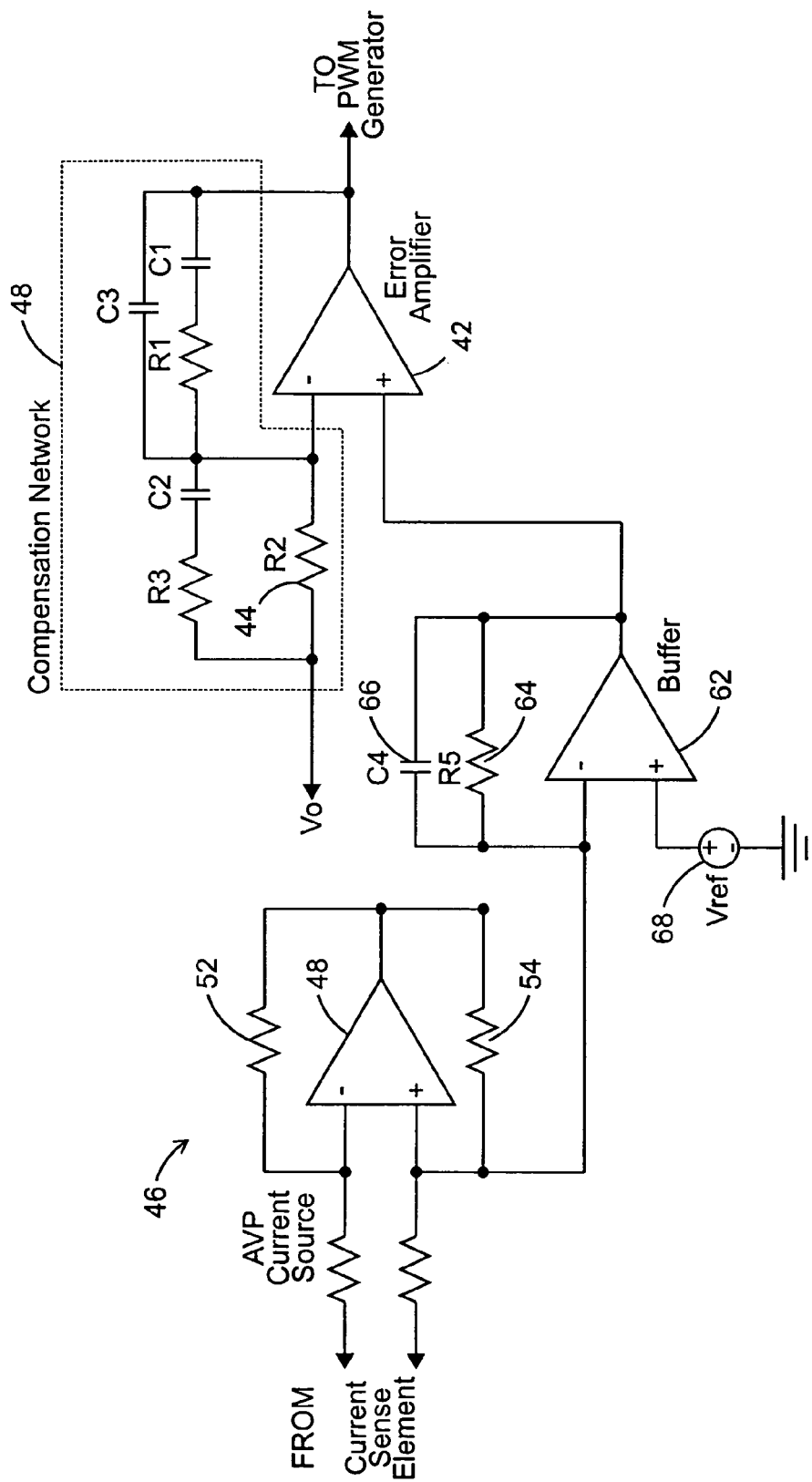
FIG. 3 is a partial schematic circuit diagram of a controller illustrating implementation of the AVP function according to the present invention.

FIG. 3 illustrates a preferred implementation of the AVP methodology according to the invention. Here, the portion of a controller 40 illustrated includes an error amplifier 42 having a first input resistor 44 connected to the output voltage feedback signal $V_O$. The output of error amplifier 42 is connected as an input to a PWM generator corresponding to 24 in the circuit illustrated in FIG. 2.

In the circuit of FIG. 2, AVP current source 36 is coupled to the same input of error amplifier 20 as the voltage feedback signal. In contrast, according to the present invention, as illustrated in FIG. 3, the AVP current source, generally denoted at 46, is connected to a separate input of error amplifier 42, and therefore input resistor 44 is not part of the AVP circuit.

According to the invention, the AVP current source 46 and the input amplifier 48 has its direct and inverting inputs connected to the output current sense element to provide an offset signal determined by amplifier 48 and resistors 50 and 52. This is coupled to the inverting input of a buffer amplifier 62 which has its direct input coupled to the reference signal source 68 which defines the nominal supply voltage. Thus, the output of buffer amplifier 62 creates an offset voltage between the error amplifier and the voltage reference.

An RC feedback circuit including a resistor 64 in parallel with a capacitor 66 controls the loop response of the AVP circuit.

Selection of the values of resistors 52, 54, and 64 and of capacitor 66 allows the user to optimize the gain and response characteristic of the AVP circuit 60 according to application requirements, independent of the gain of the error loop.

The present invention can be implemented using customary fabrication techniques to provide an IC controller which includes error amplifier 42, compensation network 48 and AVP circuit 60, it is also possible to implement the error compensation loop and the AVP loop in separate ICs. As will be appreciated by those skilled in the art, this permits employment of the AVP implementation of the present invention with existing IC controllers.

Figure 4:
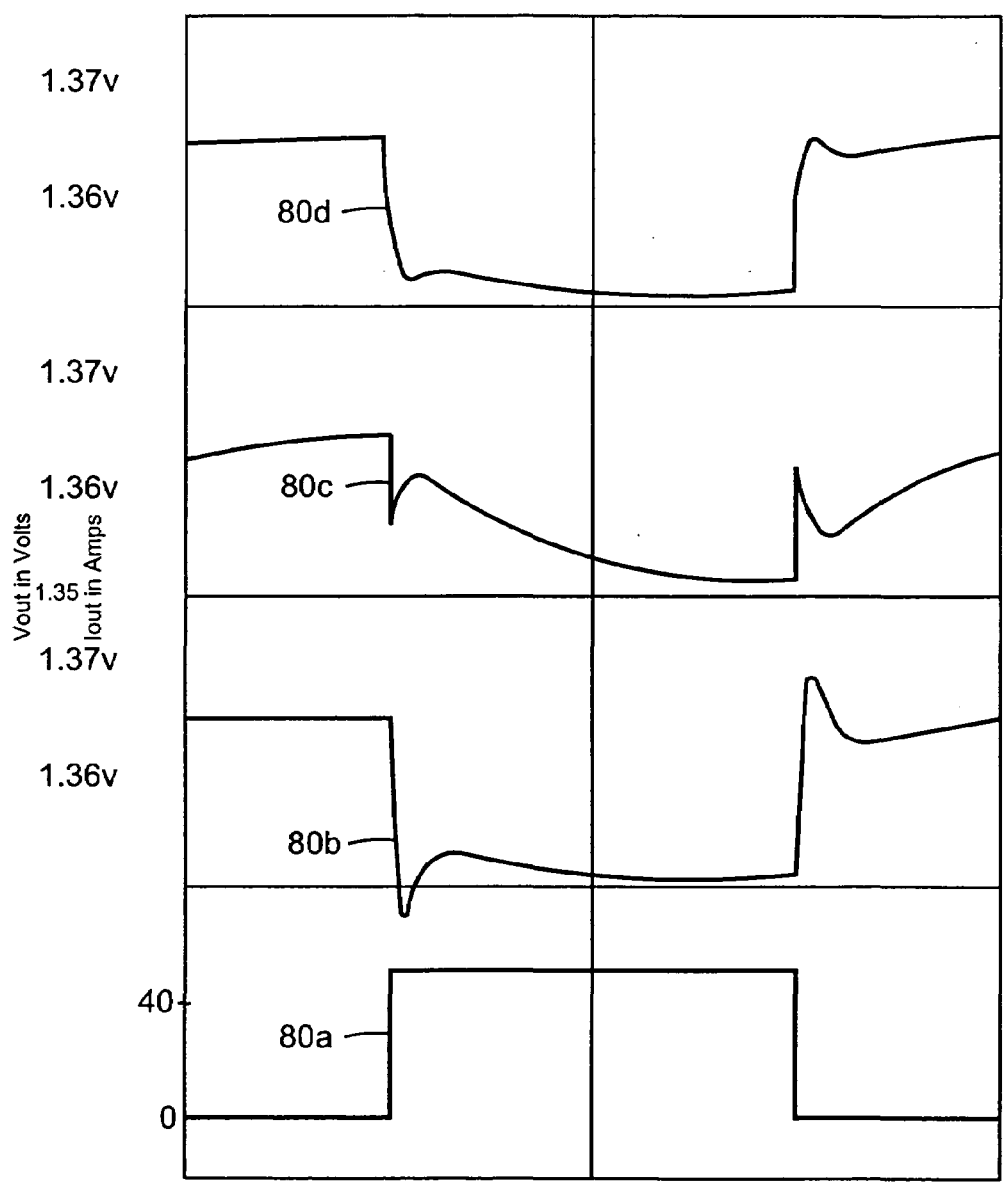
FIG. 4 is a waveform diagram illustrating the benefits of the present invention compared to conventional practice.

FIG. 4 illustrates a modeled range of AVP behavior and the benefits achievable by an AVP circuit according to the invention, in comparison with conventional practice. In FIG. 4, waveform 80a represents step changes in a power supply current output as dictated by operation of an associated microprocessor. For this example, the power supply is required to provide current varying from 0 amperes to about 50 amperes. Waveform 80b illustrates an overcompensated AVP waveform, i.e., in which the AVP loop response is too fast. This results in overshoot and undershoot peaks. Conversely, waveform 80c represents an under-compensated AVP waveform, i.e., in which the transient response of the AVP loop is too slow to follow the current changes effectively.

In contrast, waveform 80d shows the behavior of a properly compensated AVP loop.

Waveforms 80b and 80c are typical of the performance achieved with conventional circuits such as illustrated in FIG. 2 due to the use of error amplifier input resistor 34 as part of both the error compensation circuit and the AVP cirucit. Waveform 80d represents performance which can be achieved by proper compensation using the implementation illustrated in FIG. 3, because the eoror and AVP loop transient responses can be set independently.

Figure 5:
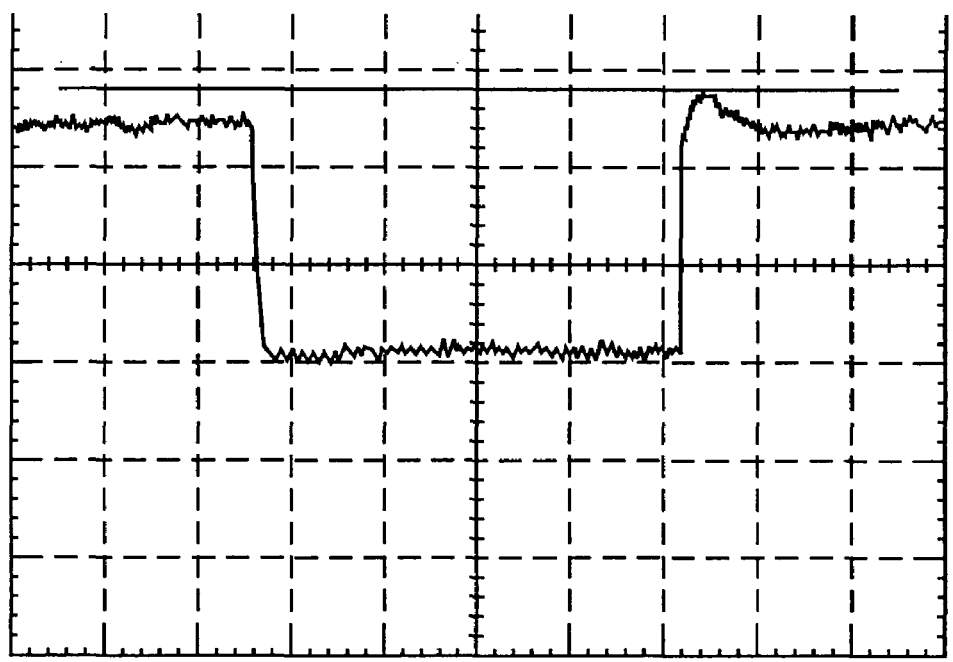
FIG. 5 is a waveform diagram showing actual performance of an AVP implementation according to the present invention.

The actual performance of a properly compensated AVP circuit implemented according to FIG. 3 is illustrated in FIG. 5.

The illustrated embodiment employs a load current feedback signal to vary the offset for the voltage reference, which is conventional in switching regulators. However, it should be apparent to those skilled in the art that it is also possible to control the offset on a predictive basis by analyzing the upcoming operations to be performed by the microprocessor. From this, operations likely require a step change in the power supply load current can be identified, and the output of the AVP current source adjusted accordingly.

Although the present invention has been described in relation to particular embodiments thereof, many other variations and modifications and other uses will become apparent to those skilled in the art. It is intended, therefore, that the invention not be limited not by the specific disclosure herein, but that it be given the fully scope possible according to the appended claims.

What is claimed is:

1. A power supply controller comprising:
   an error correction circuit including an error amplifier, an input circuit for the error amplifier, and a feedback compensation network; and
   an active voltage positioning (AVP) circuit which cooperates with the error correction circuit to maintain the voltage output of the power supply within a predetermined voltage range $V_{max}$ to $V_{min}$ independent of rapid changes in power supply load current,
   the AVP circuit including:
      a buffer circuit having an output connected to the input circuit for the error amplifier;
      an AVP signal source coupled to provide an input to the buffer circuit which varies according to the power supply output current; and
      a compensation circuit operative to control the transient behavior of the buffer circuit in response to changes in the buffer circuit input provided by the AVP signal source.

2. A power supply controller according to claim 1, wherein the AVP circuit and the error amplifier are in separate integrated circuits.

3. A power supply controller according to claim 1, wherein the AVP circuit and the error amplifier are in a single integrated circuit.

4. A power supply controller according to claim 1, wherein the AVP signal signal source is provided by a power supply load current sensing element coupled to an input amplifier having a predetermined gain.

5. A power supply controller according to claim 4, wherein:
   the buffer circuit includes a buffer amplifier having direct and inverting inputs;
   the input signal source is connected to one of the buffer amplifier inputs; and
   a reference voltage signal is connected to the other of the buffer amplifier inputs.

6. A power supply controller according to claim 5, wherein:
- the buffer circuit includes a buffer circuit having an output connected to the error circuit and an input connected to the AVP circuit, and
- the compensation network for the buffer amplifier comprises a feedback circuit connected between the output of the buffer amplifier and the input connected to the AVP signal source.

7. A power supply controller according to claim 6, wherein the compensation network for the buffer circuit comprises a parallel RC circuit connected between the input and output of the buffer amplifier.

8. A power supply controller according to claim 1, wherein:
- the buffer circuit includes a buffer circuit having an output connected to the error circuit and an input connected to the AVP circuit, and
- the compensation network for the buffer amplifier comprises a feedback circuit connected between the output of the buffer amplifier and the input connected to the AVP signal source.

9. A power supply controller according to claim 1, wherein the compensation network for the buffer circuit comprises a parallel RC circuit connected between the input and output of the buffer amplifier.

10. A power supply controller according to claim 1 wherein:
- the error circuit includes an error amplifier having direct and inverting inputs;
- one of the inputs is provided by a feedback signal derived from the power supply load current; and
- the second input is provided by an output of the buffer circuit.

11. A power supply controller according to claim 5, wherein the AVP circuit is operative to provide an offset to the reference voltage signal which causes the power supply output voltage to approach $V_{max}$ when the load current is low and to approach $V_{min}$ when the load current is high, whereby increases in output voltage resulting from a rapid drop in load current are not sufficient to cause the output voltage to exceed $V_{max}$ and decreases in the output voltage resulting from a rapid increase in load current are not sufficient to cause the output voltage to fall below $V_{min}$.

12. A power supply controller comprising:
- an error correction circuit including an error amplifier, an input circuit for the error amplifier and a feedback compensation network; and
- an active voltage positioning (AVP) circuit which cooperates with the error correction circuit to maintain the voltage output of the power supply within a predetermined voltage range $V_{max}$ to $V_{min}$ independent of rapid changes in the power supply current,
- the AVP circuit including:
  - a buffer circuit having an output connected to an input of the error correction circuit;
  - an AVP signal source coupled to a first input of the buffer circuit;
  - a voltage reference signal connected to a second input of the buffer circuit; and
  - a compensation circuit operative to control the transient behavior of the buffer circuit in response to changes in the buffer input provided by the AVP signal source,
  - the AVP circuit being operative to adjust the output of the buffer circuit relative to the reference voltage to cause the power supply output voltage to approach $V_{max}$ when the power supply load current is low, and to approach $V_{min}$ when the power supply load current is high, whereby increases in the output voltage resulting from a rapid drop in load current are not sufficient to cause the output voltage to exceed $V_{max}$ and decreases in the output voltage resulting from a rapid increase in load current are not sufficient to cause the output voltage to fall below $V_{min}$.

* * * * *